(12) United States Patent
Glass et al.

(10) Patent No.: US 10,090,383 B2
(45) Date of Patent: Oct. 2, 2018

(54) COLUMN IV TRANSISTORS FOR PMOS INTEGRATION

(71) Applicant: INTEL CORPORATION, Santa Clara, CA (US)

(72) Inventors: Glenn A. Glass, Portland, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/255,902

(22) Filed: Sep. 2, 2016

(65) Prior Publication Data

US 2016/0372547 A1 Dec. 22, 2016

Related U.S. Application Data

(63) Continuation of application No. 13/990,249, filed as application No. PCT/US2011/066129 on Dec. 20, (Continued)

(51) Int. Cl.
*H01L 29/66* (2006.01)
*H01L 29/06* (2006.01)
(Continued)

(52) U.S. Cl.
CPC .... *H01L 29/0676* (2013.01); *H01L 21/02532* (2013.01); *H01L 21/28512* (2013.01);
(Continued)

(58) Field of Classification Search
CPC ............ H01L 29/66462; H01L 29/165; H01L 29/66431; H01L 29/517; H01L 29/7848; H01L 29/7783; H01L 29/785
See application file for complete search history.

(56) References Cited

U.S. PATENT DOCUMENTS 5,089,872 A 2/1992 Ozturk et al.
5,216,271 A 6/1993 Takagi et al.
(Continued)

FOREIGN PATENT DOCUMENTS

CN 101087002 A 12/2007
EP 11 850 136.0 10/2015
(Continued)

OTHER PUBLICATIONS

Korean Notice of Final Rejection received for Korean Patent Application No. 10-2013-7016008, dated Dec. 22, 2014, 6 pages.
(Continued)

*Primary Examiner* — Jaehwan Oh
*Assistant Examiner* — John M Parker
(74) *Attorney, Agent, or Firm* — Finch & Maloney PLLC

(57) ABSTRACT

Techniques are disclosed for forming column IV transistor devices having source/drain regions with high concentrations of germanium, and exhibiting reduced parasitic resistance relative to conventional devices. In some example embodiments, the source/drain regions each includes a thin p-type silicon or germanium or SiGe deposition with the remainder of the source/drain material deposition being p-type germanium or a germanium alloy (e.g., germanium: tin or other suitable strain inducer, and having a germanium content of at least 80 atomic % and 20 atomic % or less other components). In some cases, evidence of strain relaxation may be observed in the germanium rich cap layer, including misfit dislocations and/or threading dislocations and/or twins. Numerous transistor configurations can be used, including both planar and non-planar transistor structures (e.g., FinFETs and nanowire transistors), as well as strained and unstrained channel structures.

20 Claims, 9 Drawing Sheets

Related U.S. Application Data 2011, now Pat. No. 9,437,691, which is a continuation-in-part of application No. 12/975,278, filed on Dec. 21, 2010, now Pat. No. 8,901,537.

(51) Int. Cl.

| | | |
|---|---|---|
| *H01L 21/285* | (2006.01) | |
| *H01L 29/165* | (2006.01) | |
| *H01L 29/45* | (2006.01) | |
| *H01L 29/49* | (2006.01) | |
| *H01L 29/78* | (2006.01) | |
| *H01L 29/167* | (2006.01) | |
| *H01L 21/02* | (2006.01) | |
| *H01L 29/08* | (2006.01) | |
| *H01L 29/36* | (2006.01) | |
| *H01L 27/092* | (2006.01) | |
| *H01L 23/535* | (2006.01) | |
| *H01L 29/417* | (2006.01) | |

(52) U.S. Cl.
CPC ...... *H01L 21/28525* (2013.01); *H01L 23/535* (2013.01); *H01L 27/092* (2013.01); *H01L 27/0924* (2013.01); *H01L 29/0847* (2013.01); *H01L 29/165* (2013.01); *H01L 29/167* (2013.01); *H01L 29/36* (2013.01); *H01L 29/41791* (2013.01); *H01L 29/45* (2013.01); *H01L 29/456* (2013.01); *H01L 29/4966* (2013.01); *H01L 29/6659* (2013.01); *H01L 29/66477* (2013.01); *H01L 29/66545* (2013.01); *H01L 29/66628* (2013.01); *H01L 29/66636* (2013.01); *H01L 29/66681* (2013.01); *H01L 29/78* (2013.01); *H01L 29/785* (2013.01); *H01L 29/7816* (2013.01); *H01L 29/7833* (2013.01); *H01L 29/7848* (2013.01); *H01L 29/7851* (2013.01)

(56) References Cited

U.S. PATENT DOCUMENTS

| | | |
|---|---|---|
| 5,281,552 A | 1/1994 | King et al. |
| 5,296,386 A | 3/1994 | Aronowitz et al. |
| 5,296,387 A | 3/1994 | Aronowitz et al. |
| 5,312,766 A | 5/1994 | Aronowitz et al. |
| 6,235,568 B1 | 5/2001 | Murthy et al. |
| 6,274,894 B1 | 8/2001 | Wieczorek et al. |
| 6,541,343 B1 | 4/2003 | Murthy et al. |
| 6,605,498 B1 | 8/2003 | Murthy et al. |
| 6,607,948 B1 | 8/2003 | Sugiyama et al. |
| 6,621,131 B2 | 9/2003 | Murthy et al. |
| 6,653,700 B2 | 11/2003 | Chau et al. |
| 6,797,556 B2 | 9/2004 | Murthy et al. |
| 6,812,086 B2 | 11/2004 | Murthy et al. |
| 6,861,318 B2 | 3/2005 | Murthy et al. |
| 6,885,084 B2 | 4/2005 | Murthy et al. |
| 6,887,762 B1 | 5/2005 | Murthy et al. |
| 6,933,589 B2 | 8/2005 | Murthy et al. |
| 6,949,482 B2 | 9/2005 | Murthy et al. |
| 6,952,040 B2 | 10/2005 | Chau et al. |
| 6,972,228 B2 | 12/2005 | Doyle et al. |
| 7,060,576 B2 | 6/2006 | Lindert et al. |
| 7,129,139 B2 | 10/2006 | Murthy et al. |
| 7,135,724 B2 | 11/2006 | Chen et al. |
| 7,138,320 B2 | 11/2006 | Van Bentum et al. |
| 7,138,697 B2 | 11/2006 | Chu et al. |
| 7,226,842 B2 | 6/2007 | Murthy et al. |
| 7,244,668 B2 | 7/2007 | Kim |
| 7,274,055 B2 | 9/2007 | Murthy et al. |
| 7,338,873 B2 | 3/2008 | Murthy et al. |
| 7,358,547 B2 | 4/2008 | Murthy et al. |
| 7,391,087 B2 | 6/2008 | Murthy et al. |
| 7,402,872 B2 | 7/2008 | Murthy et al. |
| 7,427,775 B2 | 9/2008 | Murthy et al. |
| 7,436,035 B2 | 10/2008 | Murthy et al. |
| 7,491,643 B2 | 2/2009 | Lavoie et al. |
| 7,492,017 B2 | 2/2009 | Murthy et al. |
| 7,494,858 B2 | 2/2009 | Bohr et al. |
| 7,518,196 B2 | 4/2009 | Chau et al. |
| 7,544,997 B2 | 6/2009 | Zhang et al. |
| 7,662,689 B2 | 2/2010 | Boyanov et al. |
| 7,663,192 B2 | 2/2010 | Sell et al. |
| 7,678,631 B2 | 3/2010 | Murthy et al. |
| 7,682,887 B2 | 3/2010 | Dokumaci et al. |
| 7,682,916 B2 | 3/2010 | Murthy et al. |
| 7,732,285 B2 | 6/2010 | Sell et al. |
| 7,821,044 B2 | 10/2010 | Bohr et al. |
| 7,880,228 B2 | 2/2011 | Yasutake |
| 8,039,902 B2 | 10/2011 | Kim et al. |
| 8,354,694 B2 | 1/2013 | Bedell et al. |
| 8,575,652 B2 | 11/2013 | Kamata |
| 8,598,003 B2 | 12/2013 | Murthy et al. |
| 8,901,537 B2 | 12/2014 | Murthy et al. |
| 8,994,104 B2 | 3/2015 | Glass et al. |
| 9,117,791 B2 | 8/2015 | Glass et al. |
| 9,349,810 B2 | 5/2016 | Glass et al. |
| 9,437,691 B2 | 9/2016 | Glass et al. |
| 9,484,432 B2 | 11/2016 | Glass et al. |
| 9,627,384 B2 | 4/2017 | Murthy et al. |
| 2002/0197806 A1 | 12/2002 | Furukawa et al. |
| 2003/0057416 A1 | 3/2003 | Currie et al. |
| 2005/0130454 A1 | 6/2005 | Murthy et al. |
| 2005/0145944 A1 | 7/2005 | Murthy et al. |
| 2005/0184354 A1 | 8/2005 | Chu et al. |
| 2006/0060859 A1 | 3/2006 | Joshi et al. |
| 2006/0065914 A1 | 3/2006 | Chen et al. |
| 2006/0125025 A1* | 6/2006 | Kawashima ........... B82Y 10/00 257/401 |
| 2006/0138398 A1 | 6/2006 | Shimamune et al. |
| 2006/0148151 A1 | 7/2006 | Murthy et al. |
| 2006/0156080 A1 | 7/2006 | Tellkamp et al. |
| 2006/0172511 A1 | 8/2006 | Kammier et al. |
| 2006/0199622 A1 | 9/2006 | Bhanji et al. |
| 2006/0237746 A1 | 10/2006 | Orlowski et al. |
| 2006/0255330 A1 | 11/2006 | Chen et al. |
| 2006/0289856 A1 | 12/2006 | Shimamune et al. |
| 2007/0004123 A1 | 1/2007 | Bohr et al. |
| 2007/0053381 A1 | 3/2007 | Chacko et al. |
| 2007/0075378 A1* | 4/2007 | Lin ................. H01L 29/1054 257/383 |
| 2007/0187767 A1 | 8/2007 | Yasutake |
| 2007/0235802 A1 | 10/2007 | Chong et al. |
| 2007/0238236 A1 | 10/2007 | Cook, Jr. et al. |
| 2007/0275548 A1 | 11/2007 | Lavoie et al. |
| 2008/0054347 A1 | 3/2008 | Wang |
| 2008/0135878 A1 | 6/2008 | Kim et al. |
| 2008/0135949 A1* | 6/2008 | Lo ....................... B82Y 10/00 257/401 |
| 2008/0179752 A1 | 7/2008 | Yamauchi et al. |
| 2008/0197412 A1 | 8/2008 | Zhang et al. |
| 2008/0230805 A1 | 9/2008 | Hokazono et al. |
| 2008/0242037 A1 | 10/2008 | Sell et al. |
| 2009/0075029 A1 | 3/2009 | Thomas et al. |
| 2009/0224369 A1 | 9/2009 | Gamble et al. |
| 2009/0302348 A1 | 12/2009 | Adam et al. |
| 2010/0109044 A1 | 5/2010 | Tekleab et al. |
| 2010/0123198 A1 | 5/2010 | Kim et al. |
| 2010/0148217 A1 | 6/2010 | Simonelli et al. |
| 2010/0197092 A1 | 8/2010 | Kim et al. |
| 2010/0244154 A1 | 9/2010 | Yasutake |
| 2010/0295021 A1 | 11/2010 | Chang et al. |
| 2011/0062498 A1 | 3/2011 | Yang et al. |
| 2011/0068407 A1 | 3/2011 | Yeh et al. |
| 2011/0147828 A1 | 6/2011 | Murthy et al. |
| 2011/0183486 A1 | 7/2011 | Chan et al. |
| 2012/0007051 A1 | 1/2012 | Bangsaruntip et al. |
| 2012/0037998 A1 | 2/2012 | Bedell |
| 2012/0153387 A1 | 6/2012 | Murthy et al. |
| 2013/0240989 A1 | 9/2013 | Glass et al. |
| 2013/0248999 A1 | 9/2013 | Glass |
| 2013/0264639 A1 | 10/2013 | Glass et al. |
| 2014/0070377 A1 | 3/2014 | Yu et al. |

(56) References Cited

U.S. PATENT DOCUMENTS

| | | | |
|---|---|---|---|
| 2014/0231914 | A1 | 8/2014 | Chang et al. |
| 2015/0060945 | A1 | 3/2015 | Murthy et al. |
| 2015/0206942 | A1 | 7/2015 | Glass et al. |
| 2015/0333180 | A1 | 11/2015 | Glass et al. |
| 2016/0322359 | A1 | 11/2016 | Glass et al. |
| 2016/0372547 | A1 | 12/2016 | Glass et al. |

FOREIGN PATENT DOCUMENTS

| | | |
|---|---|---|
| EP | 11 850 350.7 | 10/2015 |
| EP | 11 852 027.9 | 10/2015 |
| EP | 11 851 579.0 | 11/2015 |
| JP | S6313379 A | 1/1988 |
| JP | H10261792 A | 9/1998 |
| JP | 2005183160 A | 7/2005 |
| JP | 2006186240 A | 7/2006 |
| JP | 2007036205 A | 2/2007 |
| JP | 2007165665 A | 6/2007 |
| JP | 2007169958 A | 7/2007 |
| JP | 2007214481 A | 8/2007 |
| JP | 2007294757 A | 11/2007 |
| JP | 2007294780 A | 11/2007 |
| JP | 2007318132 A | 12/2007 |
| JP | 2008034650 | 2/2008 |
| JP | 2008192989 | 8/2008 |
| JP | 2008533695 A | 8/2008 |
| JP | 2008218725 A | 9/2008 |
| JP | 2009514248 A | 4/2009 |
| JP | 2009164281 A | 7/2009 |
| JP | 2009200090 A | 9/2009 |
| JP | 2010519734 A | 6/2010 |
| JP | 2010171337 A | 8/2010 |
| JP | 2010272859 A | 12/2010 |
| JP | 2012510720 A | 5/2012 |
| KR | 20090118935 | 11/2009 |
| KR | 20090118935 A | 11/2009 |
| TW | 101148097 | 4/2016 |
| WO | 2008100687 A1 | 8/2008 |
| WO | 2010014246 A1 | 2/2010 |
| WO | 2010068530 A2 | 6/2010 |
| WO | 2011084262 A2 | 7/2011 |
| WO | 2012087403 A1 | 6/2012 |
| WO | 2012087404 A1 | 6/2012 |
| WO | 2012087581 A2 | 6/2012 |
| WO | 2012088097 A2 | 6/2012 |

OTHER PUBLICATIONS

Office Action received for Taiwan Patent Application No. 101148097, dated Oct. 13, 2014, 27 pages of Office Action including 13 pages of English Translation.
Lin Ting Yu, "Silicon Nanowire Field Effect Transistor," date of thesis Aug. 5, 2009. English abstract with original retrieved online at URL: http://translate.google.com/translate?hl=en&sl=zh-TW&u=http://ir.lib.ntnu.edu.tw/handle/309250000Q/75302&prev=search. Nov. 19, 2014, 23 pages.
Continuation U.S. Appl. No. 14/535,387, filed Nov. 7, 2014, 64 pages.
"Metal/Semiconductor Ohmic Contacts Technology or Gate length Series Resistance (ohms)," URL: http://web.standford.edu/class/ee311/NOTES/Ohmic_Contacts.pdf. Retrieved Jul. 8, 2014 (1997) 25 pages.
European Patent Office Search Report received for EP Application No. 11852027.9. dated Aug. 14, 2014. 14 pages.
JP Notification of Reason(s) for Refusal, Japanese Patent Application No. 2013-546134, dated Aug. 26, 2014. 4 pages of English Translation and 3 pages of Office Action.
Notice of Reasons for Rejection issued by JP Patent Office for JP Application No. 2013-546135. dated Aug. 26, 2014. 7 pages (including Organized Translation of Notice of Reasons for Rejection).
Taiwan Office Action issued for TW Application No. 100145538. dated Sep. 12, 2014. 23 pages (including Translation of Notice).
Notice of Reasons for Rejection issued by JP Patent Office for JP Application No. 2013-546324. dated Aug. 22, 2014. 8 pages (including Organized Translation of Notice of Reasons for Rejection).
Office Action received for Korean Patent Application No. 10-2013-7016008, dated May 23, 2014, 4 pages of English Translation and 5 pages of Office Action.
Office Action received for Korean Patent Application No. 10-2013-7016371, dated May 23, 2014, 5 pages of English Translation and 6 pages of Office Action.
Office Action received for Korean Patent Application No. 2013-7015944, dated May 23, 2014, 4 pages of English Translation.
Office Action received for Korean Patent Application No. 2013-7016072, dated May 23, 2014, 4 pages English Translation.
Notice of Reasons for Rejection issued by JP Patent Office for JP Application No. 2013-543323. dated Aug. 5, 2014. 7 pages (including Organized Translation of Notice of Reason for Rejection).
International Search Report and Written Opinion received for PCT Application No. PCT/US2010/058199, dated Jul. 13, 2011, 10 pages.
International Preliminary Report on Patentability received for PCT Application No. PCT/US2010/058199, dated Jul. 5, 2012, 2 pages.
International Search Report and Written Opinion received for PCT Application No. PCT/US2011/054198, dated Apr. 19, 2012, 13 pages.
International Search Report and Written Opinion received for PCT Application No. PCT/US2011/063813, dated Jul. 23, 2012, 10 pages.
Zhu et al., "Germanium pMOSFETs With Schottky-Barrier Germanide S/D, High-K Gate Dielectric and Metal Gate", IEEE electron Device Letters, vol. 26, Issue No. 2, Feb. 2005, pp. 81-83.
International Search Report and Written Opinion received for PCT Application No. PCT/US2011/066129, dated Aug. 24, 2012, 11 pages.
International Preliminary Report on Patentability received for PCT Application No. PCT/US2011/063813, dated Jul. 4, 2013, 7 pages.
International Preliminary Report on Patentability and Written Opinion received for PCT Application No. PCT/US2011/054198, dated Jun. 25, 2013, 9 pages.
International Preliminary Report on Patentability and Written Opinion received for PCT Application No. PCT/US2011/054202, dated Jun. 25, 2013, 9 pages.
Datta et al., "Advanced Si and SiGe Strained Channel NMOS and PMOS Transistors with High-K/Metal-GareStack", IEEE Xplore, Downloaded: Nov. 14, 2009, pp. 194-197.
Taiwan Decision of Rejection dated Dec. 26, 2014 for Taiwan Patent Application No. 100145538. 22 pages.
Korean Intellectual Property Office Notice of Final Rejection for KR Application No. 10-2013-7016371 dated Nov. 14, 2014; 6 pages with 3 pages of English Translation.
International Preliminary Report on Patentability and Written Opinion received for PCT Application No. PCT/US2011/066129, dated Jun. 25, 2013, 9 pages.
U.S. Appl. No. 13/990,249, filed May 29, 2013, 35 pages.
European Patent Office Search Report received for EP Application No. 11850136.0, dated Aug. 14, 2014, 14 pages.
International Search Report and Written Opinion received for PCT Application No. PCT/US2011/054202, dated Apr. 19, 2012, 13 pages.
Taiwan Decision of Final Rejection received for Taiwan Patent Application No. 101148097. dated Feb. 12, 2015, 28 pages.
Korean Notice of Final Rejection received for Korean Patent Application No. 2013-7015944. dated Dec. 22, 2014, 7 pages.
European Patent Office Search Report received for EP Application No. 11850136.0. dated Oct. 9, 2015, 5 pages.
European Patent Office Search Report received for EP Application No. 11850350.7. dated Oct. 6, 2015, 8 pages.
European Patent Office Search Report received for EP Application No. 11851579.0. dated Nov. 2, 2015, 5 pages.
European Patent Office Search Report received for EP Application No. 11852027.9. dated Oct. 12, 2015, 4 pages.
Taiwan Decision of Rejection dated Apr. 15, 2016 for Taiwan Patent Application No. 101148097. 30 pages.

(56) References Cited

OTHER PUBLICATIONS

Lin Ting Yu, "Silicon Nanowire Field Effect Transistor," date of thesis Aug. 5, 2009. English abstract with original retrieved online at URL: http://translate.google.com/translate?hl=en&sl=zh-Tin&u=http://ir.lib.ntnu.edu.tw/handle/309250000Q/75302&prev=search. Nov. 19, 2014, 23 pages.
Korean Intellectual Property Office Notice of Final Rejection for KR Application No. 10-2013-7016371. dated Nov. 14, 2014; 6 pages with 3 pages of English Translation.
European Patent Office Search Report received for EP Application No. 11850136.0. dated Aug. 14, 2014, 14 pages.
Hellings, et al., "High Performance 70-nm Germanium pMOSFETs With Boron LDD Implants," IEEE Electron Device Letters, vol. 30, N0. 1, Jan. 2009. pp. 88-903
EP Office Action received for EP Application No. 11 850 350.7-1552, dated May 10, 2017. 5 pages.
Korean Notice of Preliminary Rejection received for Korean Patent Application No. 10-2016-7036162. dated Feb. 17, 2017, 8 pages, including English translation.
Korean Notice of Preliminary Rejection received for Korean Patent Application No. 2015-7012262. dated Jan. 18, 2017, 16 pages, including English translation.
U.S. Appl. No. 13/990,238, filed May 29, 2013, Pending.
U.S. Appl. No. 13/990,224, filed May 29, 2013, Patented.
U.S. Appl. No. 13/990,249, filed May 29, 2013, Patented.
U.S. Appl. No. 14/535,387, filed Nov. 7, 2014, Pending.
U.S. Appl. No. 12/975,278, filed Dec. 21, 2010, Patented.
U.S. Appl. No. 14/673,143, filed Mar. 30, 2015, Pending.
U.S. Appl. No. 14/807,285, filed Jul. 23, 2015, Patented.
U.S. Appl. No. 15/162,551, filed May 23, 2016, Pending.
U.S. Appl. No. 13/990,238, filed May 29, 2013, Patented.
U.S. Appl. No. 14/673,143, filed Mar. 30, 2015, Patented.
U.S. Appl. No. 15/339,308, filed Oct. 31, 2016, Pending.

\* cited by examiner

COLUMN IV TRANSISTORS FOR PMOS INTEGRATION

RELATED APPLICATION

This patent application is a continuation of U.S. application Ser. No. 13/990,249, filed May 29, 2013, now U.S. Pat. No. 9,437,691, which is a U.S. National Stage Application of International Application No. PCT/US2011/066129, filed Dec. 20, 2011, which is a continuation-in-part of and claims priority to U.S. application Ser. No. 12/975,278 filed Dec. 21, 2010.

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of metal oxide semiconductor (MOS) transistor semiconductor devices, such as those used in a complementary metal oxide semiconductor (CMOS), it is often desired to minimize the parasitic resistance associated with contacts otherwise known as external resistance Rext. Decreased Rext enables higher current from an equal transistor design.

As will be appreciated, the figures are not necessarily drawn to scale or intended to limit the claimed invention to the specific configurations shown. For instance, while some figures generally indicate straight lines, right angles, and smooth surfaces, an actual implementation of a transistor structure may have less than perfect straight lines and/or right angles, and some features may have surface topology or otherwise be non-smooth, given real world limitations of the processing equipment and techniques used. In short, the figures are provided merely to show example structures.

DETAILED DESCRIPTION

Techniques are disclosed for forming column IV transistor devices having source and drain regions with high concentrations of germanium, and exhibiting reduced parasitic resistance relative to conventional devices. In some example embodiments, the source/drain regions of the resulting transistor structure each include a thin p-type silicon or germanium or silicon germanium (SiGe) liner layer with the remainder of the source/drain material being p-type germanium or a germanium alloy comprising, for instance, germanium and tin, and having a germanium content of at least 80 atomic % (and 20 atomic % or less other components, such as tin and/or other suitable strain inducers). In some example cases, evidence of strain relaxation may be observed in this germanium rich layer including misfit dislocations and/or threading dislocations. Numerous transistor configurations and suitable fabrication processes will be apparent in light of this disclosure, including both planar and non-planar transistor structures (e.g., FinFETs and nanowire transistors), as well as strained and unstrained channel structures. The techniques are particularly well-suited for implementing p-type MOS (PMOS) devices, although other transistor configurations may benefit as well.

General Overview

Figure 1:
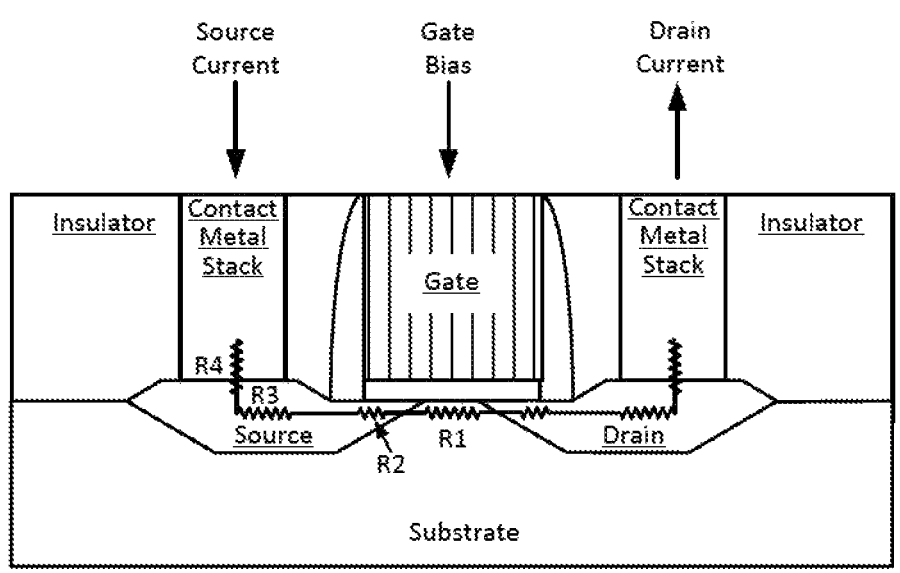
FIG. 1 schematically illustrates components of resistance of a typical MOS transistor that includes source and drain tip regions.

As previously explained, increased drive current in the transistors can generally be achieved by reducing device external resistance, Rext. However, PMOS transistor performance is a function of various component resistances within the device, as can be seen with reference to FIG. 1. Channel resistance R1 can be modulated through carrier mobility, which is a function of compressive strain within the channel. External resistance Rext of the device includes tip resistance R2 (tip region is also referred to as source/drain extension), source/drain resistance R3, and contact resistance R4 (metal to semiconductor). All of these segmented resistances have a material component (e.g., energy barrier across an interface, carrier concentration and mobility) a geometry component (e.g., length, width, etc) and a dynamic electrical load component (current crowding).

Thus, and in accordance with some embodiments of the present invention, replacing the typical silicon or SiGe alloy materials in the source/drain regions with a p-type thin liner and high content of germanium (with very high p-type doping concentration) minimizes the external resistance components (R2, R3, and R4). In addition, by introducing a highly compressively strained material, the channel hole mobility is maximized or otherwise increased and hence reduces channel resistance (R1). The net impact of decreased channel, tip, source/drain and contact resistance is improved transistor current for a given voltage (relative to threshold voltage, $V_t$, i.e. $V-V_t$).

In some example cases, the thin liner is p-type doped silicon or germanium or SiGe alloy, and is generally less than 50% of the total source/drain deposition layer thickness. The remaining source/drain deposition layer thickness is generally greater than 50% of the total source/drain deposition layer thickness and can be, for example, p-type doped germanium or a germanium alloy such as germanium: tin or germanium:tin:x (where x is, for example, silicon or other marginal component or process/diffusion-based artifact) having at least 80 atomic % germanium and 20 atomic % or less of other constituents (e.g., tin and/or any other suitable strain inducer and/or other marginal unintentional components). In some specific such example embodiments, the thickness ratio of the source/drain liner to the high concentration germanium cap is about 1:5 or less (where the liner makes up about 20% or less of the total source/drain deposition layer thickness). In some such example cases, the thickness liner is one to several monolayers.

The techniques can be used to form transistor devices in any number of devices and systems. In some embodiments, such as CMOS devices having both n-type MOS (NMOS) and PMOS transistors, selectivity can be achieved in various ways. In one embodiment, for instance, deposition on NMOS source/drain locations can be avoided by having NMOS regions masked off during PMOS deposition. In other embodiments, selectivity may include natural selectivity. For instance, while boron doped germanium grows on p-type SiGe (or silicon) source drain regions, it does not grow on insulator surfaces such as silicon dioxide ($SiO_2$) or silicon nitride (SiN); nor does it grow on, for instance, exposed heavily phosphorous doped silicon in n-type regions.

The techniques provided herein can be employed to improve device resistance in any number of transistor structures and configurations, including planar, flush or raised source/drain, non-planer (e.g., nanowire transistors and finned transistors such as double-gate and trigate transistor structures), as well as strained and unstrained channel structures. The source/drain areas can be recessed (e.g., using an etch process) or not recessed (e.g., formed on top surface of substrate). In addition, the transistor devices may optionally include source and drain tip regions that are designed, for instance, to decrease the overall resistance of the transistor while improving short channel effects (SCE), but such tip regions are not required. The transistor devices may further include any number of gate configurations, such as poly gates, high-k dielectric metal gates, replacement metal gate (RMG) process gates, or any other gate structure. Any number of structural features can be used in conjunction with low resistance transistor techniques as described herein.

A transmission electron microscopy (TEM) cross-section perpendicular to gate lines or secondary ion mass spectrometry (SIMS) profile can be used to show the germanium concentration in the structure, as profiles of epitaxial alloys of silicon and SiGe can readily be distinguished from high germanium concentration profiles, in accordance with some embodiments. In some such silicon-containing substrate cases, by forgoing the typical requirement to maintain strained (dislocation free) source/drain regions, the lattice dimension mismatch between the source/drain fill material and silicon channel can be increased by at least 2× for pure germanium and even more for germanium-tin alloys. While not 100% of the strain is able to transfer to the channel in cases where dislocations are present in the germanium rich cap layer, post deposition thermal treatments can be used to provide a clear transistor performance (current at a given $V-V_t$) gain even for relaxed films (as described herein) relative to strained SiGe controls. As will be appreciated, relaxed generally means that the films can have misfit dislocations present, but may also refer to a plastic relaxation mechanism which involves dislocation formation and propagation. A process of elastic relaxation becomes possible in non-planar configurations such as FinFET (e.g., tri-gate) and nanowire structures where the strained material is not fully constrained by the substrate. Thus, the in-plane lattice constant has more flexibility to expand or contract independent of the substrate and this process does not require formation and propagation of misfit dislocations. Going forward herein, the word relaxation is used in the sense of plastic relaxation and not in the sense of elastic relaxation. The use of tin or other suitable strain inducers to alloy the high concentration germanium cap as described herein can optionally be used to increase the strain in the channel region, and thereby further reduce the overall device resistance via reduction in resistance R1 in FIG. 1. As will further be appreciated, while defect free pure germanium may be desirable, it is generally difficult to grow defect free for deposition on, for example, a silicon substrate or even SiGe substrate having say 50 atomic % germanium. Surprisingly, however, if performance of a typical fully strained SiGe layer and such a germanium-rich layer having some defects (e.g., has misfit and/or threading dislocations) were compared, then the defective germanium-rich layer would perform better. As will be appreciated, this result is generally not intuitive, as it runs counter to the conventional understanding with respect to thin film. In any case, while some embodiments of the present invention may include germanium-rich caps that are lacking in crystal features such as misfit dislocations, threading dislocations and twins (defects resulting from a change in lattice orientation across a twin plane), other embodiments may include germanium-rich caps that have one or more such features.

Architecture and Methodology

Figure 2:
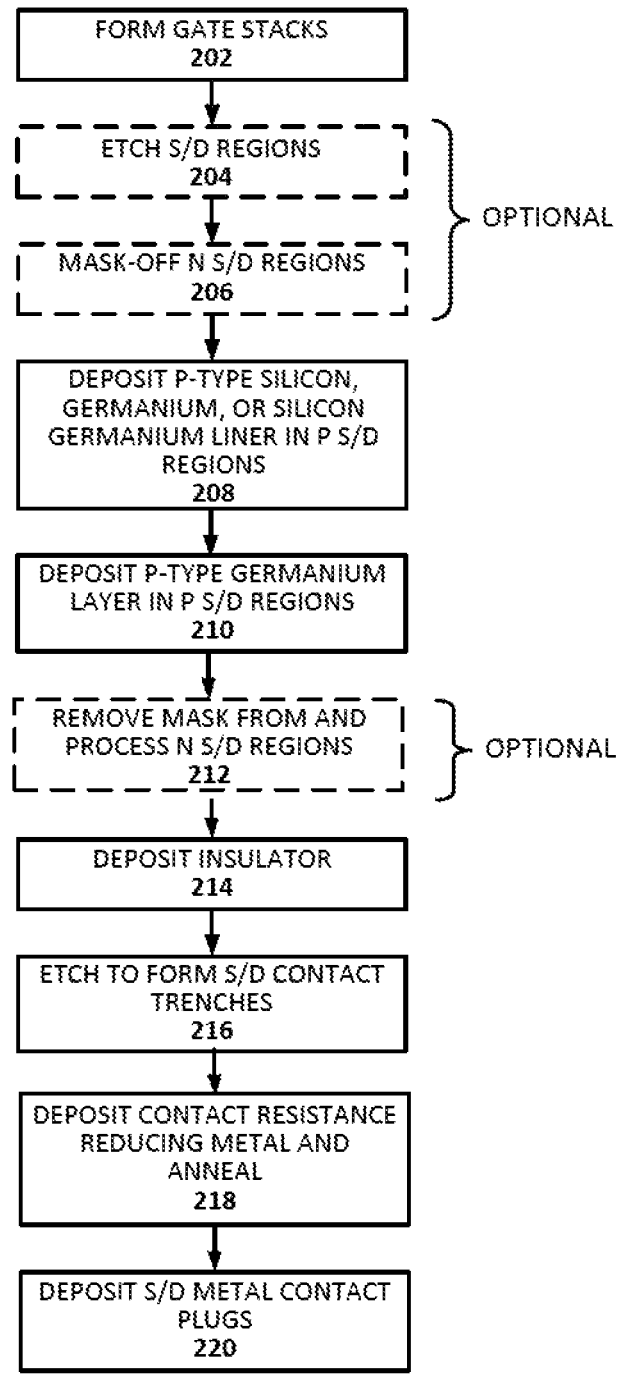
FIG. 2 is a method of forming a column IV transistor in accordance with an embodiment of the present invention.

FIG. 2 is a method of forming a column IV transistor in accordance with an embodiment of the present invention. FIGS. 3A to 3F illustrate example structures that are formed when carrying out the method of FIG. 2, in accordance with various embodiments. One or more such transistors may be formed in the fabrication of, for example, a processor or a communications chip or memory chip. Such integrated circuits can then be used in various electronic devices and systems.

Figure 3A:
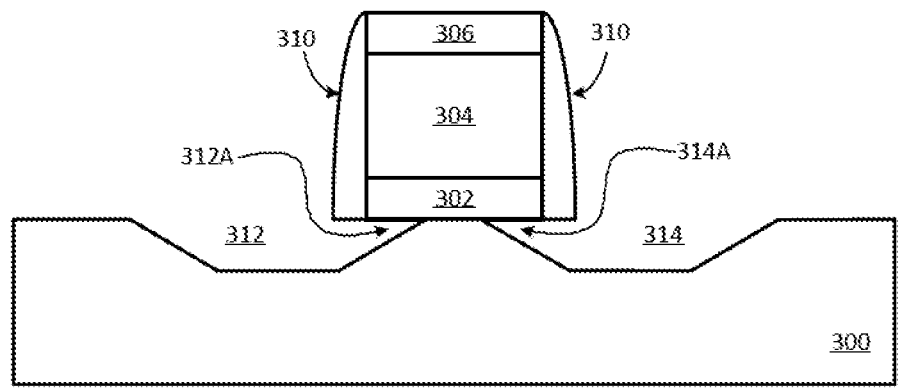
FIGS. 3A to 3F illustrate structures that are formed when carrying out the method of FIG. 2, in accordance with various embodiments of the present invention.
Figure 3B:
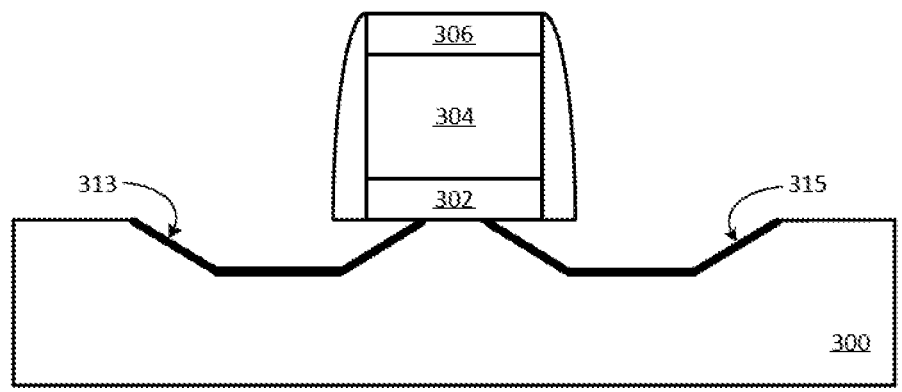

The example method includes forming 202 one or more gate stacks on a semiconductor substrate upon which a MOS device may be formed. The MOS device may comprise, for example, PMOS transistors, or both NMOS and PMOS transistors (e.g., for CMOS devices). FIG. 3A shows an example resulting structure, which in this case includes a PMOS transistor formed on substrate 300. As can be seen, the gate stack is formed over a channel region, and includes a gate dielectric layer 302, a gate electrode 304, and an optional hardmask 306. Spacers 310 are formed adjacent to the gate stack.

The gate dielectric 302 can be, for example, any suitable oxide such as silicon dioxide ($SiO_2$) or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 302 to improve its quality when a high-k material is used. In some specific example embodiments, the high-k gate dielectric layer 302 may have a thickness in the range of 5 Å to around 100 Å thick (e.g., 10 Å). In other embodiments, the gate dielectric layer 302 may have a thickness of one monolayer of oxide material. In general, the thickness of the gate dielectric 302 should be sufficient to electrically isolate the gate electrode 304 from the source and drain contacts. In some embodiments, additional processing may be performed on the high-k gate dielectric layer 302, such as an annealing process to improve the quality of the high-k material.

The gate electrode 304 material can be, for example, polysilicon, silicon nitride, silicon carbide, or a metal layer (e.g., tungsten, titanium nitride, tantalum, tantalum nitride) although other suitable gate electrode materials can be used as well. The gate electrode 304 material, which may be a sacrificial material that is later removed for a replacement metal gate (RMG) process, has a thickness in the range of about 10 Å to 500 Å (e.g., 100 Å), in some example embodiments.

The optional gate hard mask layer 306 can be used to provide certain benefits or uses during processing, such as protecting the gate electrode 304 from subsequent etch and/or ion implantation processes. The hard mask layer 306 may be formed using typical hard mask materials, such as silicon dioxide, silicon nitride, and/or other conventional insulator materials.

The gate stack can be formed as conventionally done or using any suitable custom techniques (e.g., conventional patterning process to etch away portions of the gate electrode and the gate dielectric layers to form the gate stack, as shown in FIG. 2A). Each of the gate dielectric 302 and gate electrode 304 materials may be formed, for example, using conventional deposition processes such as chemical vapor deposition (CVD), atomic layer deposition (ALD), spin-on deposition (SOD), or physical vapor deposition (PVD). Alternate deposition techniques may be used as well, for instance, the gate dielectric 302 and gate electrode 304 materials may be thermally grown. As will be appreciated in light of this disclosure, any number of other suitable materials, geometries, and formation processes can be used to implement an embodiment of the present invention, so as to provide a low resistance transistor device or structure as described herein.

The spacers 310 may be formed, for example, using conventional materials such as silicon oxide, silicon nitride, or other suitable spacer materials. The width of the spacers 310 may generally be chosen based on design requirements for the transistor being formed. In accordance with some embodiments, however, the width of the spacers 310 is not subject to design constraints imposed by the formation of the source and drain tip regions, given sufficiently high p-doped germanium content (e.g., boron doped germanium) or SiGe alloy liner in the source/drain tip regions.

Any number of suitable substrates can be used to implement substrate 300, including bulk substrates, semiconductors-on-insulator substrates (XOI, where X is a semiconductor material such as silicon, germanium, or germanium-enriched silicon), and multi-layered structures, including those substrates upon which fins or nanowires can be formed prior to a subsequent gate patterning process. In some specific example cases, the substrate 300 is a germanium or silicon or SiGe bulk substrate, or a germanium or silicon or SiGe on oxide substrate. Although a few examples of materials from which the substrate 300 may be formed are described here, other suitable materials that may serve as a foundation upon which a low resistance transistor device may be built falls within the spirit and scope of the claimed invention.

With further reference to FIG. 3A, after the one or more gate stacks are formed, the method continues with some optional processing which in this example embodiment includes etching 204 the source/drain regions of the transistor structure, and masking-off 206 any NMOS source/drain regions of the structure (if present). As will be appreciated, the source/drain regions need not be recessed or otherwise etched. In such cases, the source/drain materials can be formed on the substrate 300 without any etching. While such non-recessed source/drain regions will not impact channel resistance, a bi-layer source/drain structure having a thin liner and high germanium content cap can still be implemented to provide low contact resistance, in accordance with some embodiments. As will further be appreciated, not all embodiments will include n-type regions. In some example cases, for instance, the circuit being fabricated may include only PMOS devices. In such example cases, there would be no n-type source/drain regions to mask off. When n-type regions are present, any suitable masking technique can be used to protect the n-type regions during p-type processing.

In example embodiments where the source/drain regions are etched, source/drain cavities 312/314 result, as best shown in FIG. 3A. The cavities effectively define the location of the source/drain regions. As can be further seen, substrate 300 has been etched not only to provide source/drain cavities 312/314, but also their respective tip areas 312A/314A which undercut the gate dielectric 302. The cavities 312/314 and their respective tip areas 312A/314A can be formed as conventionally done using any number of suitable processes. In some example cases, this includes ion implantation to highly dope portions of substrate 300 adjacent to the gate stack followed by annealing to drive the dopants further into substrate 300 to improve the etch rate of the intended source/drain areas. A dry etch process can then be used to etch the doped regions of substrate 300 to form cavities 312/314 and their respective tip areas 312A/314A. After the dry etch process has completed, a wet etch may be used, for instance, to clean and further etch the cavities 312/314 and their respective tip areas 312A/314A. Such wet etching, which can be carried out using conventional or custom wet etch chemistries, can be used to remove contaminants such as carbon, fluorine, chlorofluorocarbons, and oxides such as silicon oxide to provide a clean surface upon which subsequent processes may be carried out. In addition, and assuming a monocrystalline silicon substrate, the wet etching may also be used to remove a thin portion of substrate 300 along the <111> and <001> crystallographic planes to provide a smooth surface upon which a high quality epitaxial deposition may occur. In some example cases, the thin portion of substrate 300 that is etched away may be, for example, up to 5 nm thick and may also remove residual contaminants. The wet etching generally causes edges of the cavities 312/314 and their respective tip areas 312A/314A to follow the <111> and <001> crystallographic planes.

Figure 3C:
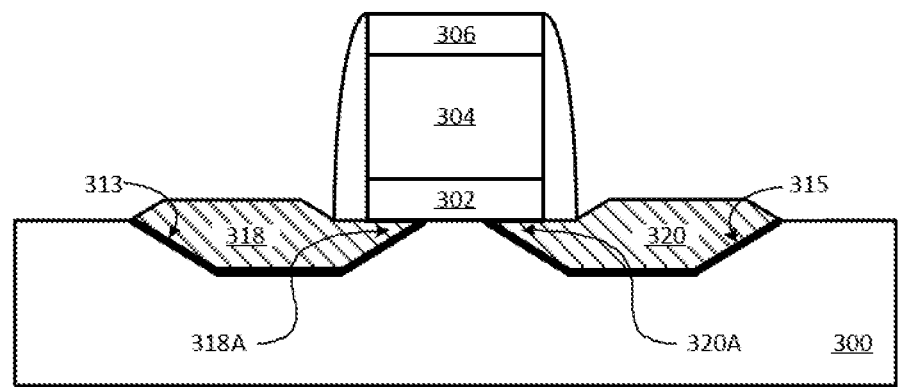

With further reference to FIG. 2, the method continues with depositing 208 a p-type silicon or germanium or SiGe liner 313/315 in the p-type source/drain regions, and then depositing 210 a p-type germanium or germanium alloy in the p-type source/drain regions over the liner 313/315. Each of these depositions can be carried out, for instance, using selective epitaxial deposition, although any suitable deposition process can be used. As can be seen with reference to FIG. 3B, the p-type silicon or germanium or SiGe liners 313/315 are deposited into cavities 312/314 and their respective tip areas 312A/314A. In addition, and as best shown in FIG. 3C, cavities 312/314 and tip areas 312A/314A have been further filled to provide a thick capping layer of p-type germanium or germanium alloy 318/320 over the p-type liners 313/315. Example p-type dopants include, for instance, boron, gallium, or any other suitable p-type dopant or dopants, as will be appreciated, and the claimed invention is not intended to be limited to any particular one.

In accordance with some specific example embodiments where the substrate 300 is a silicon or SiGe bulk substrate, or a semiconductor-on-insulator substrate (XOI, where X is silicon or SiGe), the source and drain cavities 312/314 along with their respective tip areas 312A/314A are filled with in-situ boron doped silicon or SiGe thereby forming the corresponding liners 313/315, and then further filled with in-situ boron doped germanium or germanium rich alloy to provide caps 318/320. In other example embodiments where the substrate 300 is a germanium bulk substrate or a germanium-on-insulator substrate, the source and drain cavities 312/314 along with their respective tip areas 312A/314A can be filled with in-situ boron doped germanium thereby forming the corresponding liners 313/315, and then further filled with in-situ boron doped germanium rich alloy (such as germanium:tin) to provide caps 318/320. As will be appreciated in light of this disclosure, the respective germanium and p-type dopant concentrations of the liners 313/315 and caps 318/320 can vary depending on factors such as the composition of the substrate 300, the use of grading for lattice matching/compatibility, and the overall desired thickness of the total source/drain deposition.

Numerous material system and p-type doping configurations can be implemented, as will be appreciated in light of this disclosure.

For instance, in some example embodiments having a silicon or germanium or SiGe substrate, the germanium concentration of the liners 313/315 can be in the range of 20 atomic % to 100 atomic %, and the boron concentration is in the range of $1E20$ $cm^{-3}$ to $2E21$ $cm^{-3}$. To avoid lattice mismatch with an underlying silicon-containing substrate, the germanium concentration of the liners 313/315 can be graded, in accordance with some embodiments. For example, in one such embodiment, the liners 313/315 can be a graded boron doped SiGe layer with the germanium composition graded from a base level concentration compatible with the underlying silicon or SiGe substrate 300 up to 100 atomic % (or near 100 atomic %, such as in excess of 90 atomic % or 95 atomic % or 98 atomic %). In one specific such embodiment, the germanium concentration ranges from 40 atomic % or less to in excess of 98 atomic %. The boron concentration within liners 313/315 can be fixed, for example, at a high level, or alternatively can be graded. For instance, for example, the boron concentration within liners 313/315 can be graded from a base concentration at or otherwise compatible with the underlying substrate 300 up to a desired high concentration (e.g., in excess of $1E20$ $cm^{-3}$, in excess of $2E20$ $cm^{-3}$, or in excess of $5E20$ $cm^{-3}$). In some such embodiments, the boron doped germanium caps 318/320 have a boron concentration in excess of $1E20$ $cm^{-3}$, such as in excess of $2E20$ $cm^{-3}$ or in excess of $2E21$ $cm^{-3}$, or higher. This boron concentration in the caps 318/320 can be graded in a similar fashion as described with reference to the liners 313/315. In a more general sense, the boron concentrations can be adjusted as necessary to provide the desired degree of conductivity, as will be appreciated in light of this disclosure. The germanium concentration of the caps 318/320 can be, for instance, fixed at 100 atomic %. Alternatively, germanium concentration of the caps 318/320 can be graded from a low to high concentration (e.g., from 20 atomic % to 100 atomic %), as will be appreciated in light of this disclosure, to account for lattice mismatch between the liners 313/315 and the desired peak germanium concentration of the caps 318/320. In still other embodiments, the caps 318/320 are implemented with a germanium alloy, where the blend can be, for example, up to 80 atomic % germanium and up to 20 atomic % for the alloying material, which in some embodiments is tin. Note that the tin concentration (or other alloying material) can also be graded, as will be appreciated. In one such case, channel strain is increased with a tin concentration in the range of 3 to 8 atomic % in the caps 318/320 (with the balance atomic percentage of the caps 318/320 substantially being germanium and any gradient material). In spite of relaxation, lattice constants are still relatively large and capable of applying significant strain on the adjacent channel. Other suitable tin concentrations will be apparent, as will other suitable strain inducers.

Note that with a pure germanium substrate, the liners 313/315 can be implemented with germanium and need not be graded. In some such cases, the germanium concentration of the liners 313/315 can be fixed (e.g., 100 atomic %) and the caps 318/320 can be implemented with a germanium alloy (e.g., germanium:tin, or other suitable germanium alloy as previously described). As previously explained, the germanium concentration (or the tin or other alloying material concentration) in the caps 318/320 can be graded to effect desired channel strain. In some such cases, further note that the germanium liners 313/315 can effectively be integrated with the germanium alloy caps 318/320 or otherwise be an undetectable component of the source/drain region deposition.

With respect to gradings, note that compatibility as used herein does not necessitate an overlap in concentration levels (for instance, the germanium concentration of underlying substrate 300 can be 0 to 20 atomic % and initial germanium concentration of the liners 313/315 can be 30 to 40 atomic %). In addition, as used herein, the term 'fixed' with respect to a concentration level is intended to indicate a relatively constant concentration level (e.g., the lowest concentration level in the layer is within 10% of the highest concentration level within that layer). In a more general sense, a fixed concentration level is intended to indicate the lack of an intentionally graded concentration level.

The thickness of the liners 313/315 and caps 318/320 can also vary depending on factors such as the composition of the substrate 300, the use of grading for lattice matching/compatibility, and the overall desired thickness of the total source/drain deposition. In general, the liners 313/315 may be thicker in cases where they are configured with a graded germanium content to provide compatibility with a substrate 300 that has no or an otherwise low germanium content. In other cases where the substrate 300 is a germanium substrate or otherwise contains a relatively high concentration of germanium, the liners 313/315 need not be graded, and may therefore be relatively thinner (e.g., one to several monolayers). In yet still other cases where the substrate has no or an otherwise low germanium content, the liners 313/315 can be implemented with a relatively thin layer of silicon or otherwise low germanium content material, and the germanium content of the caps 318/320 can be graded as needed for compatibility. In any such cases, the liners 313/315 generally make up less than 50% of the total source/drain deposition layer thickness, and the remaining source/drain deposition layer thickness is generally greater than 50% of the total source/drain deposition layer thickness. In accordance with some such example embodiments where the liners 313/315 are not graded, the thickness ratio of liners 313/315 to caps 318/320 is about 2:5 or less (i.e., where the liner makes up about 40% or less of the total source/drain deposition layer thickness). In some specific such embodiments, the thickness ratio of liners 313/315 to caps 318/320 is about 1:5 or less (i.e., where the liner makes up about 20% or less of the total source/drain deposition layer thickness). In one such specific example case, the thickness of liners 313/315 is in the range of one-to-several monolayers to about 10 nm, and the total source/drain deposition layer thickness is in the range of 50 to 500 nm. Numerous source/drain liner and cap geometries and material configurations will be apparent in light of this disclosure.

As will be appreciated in light of this disclosure, any number of other transistor features may be implemented with an embodiment of the present invention. For instance, the channel may be strained or unstrained, and the source/drain regions may or may not include tip regions formed in the area between the corresponding source/drain region and the channel region. In this sense, whether a transistor structure has strained or unstrained channels, or source/drain tip regions or no source/drain tip regions, is not particularly relevant to various embodiments of the present invention, and the claimed invention is not intended to be limited to any particular such structural features. Rather, any number of transistor structures and types, and particularly those structures having p-type or both n-type and p-type source/drain transistor regions, can benefit from employing a bi-layer source/drain configuration having a liner and high germanium concentration cap as described herein.

A CVD process or other suitable deposition technique may be used for depositing 208 and 210. For example, depositing 208 and 210 may be carried out in a CVD reactor, an LPCVD reactor, or an ultra high vacuum CVD (UHVCVD). In some example cases, the reactor temperature may fall, for instance, between 600° C. and 800° C. and the reactor pressure may fall, for instance, between 1 and 760 Torr. The carrier gas may include, for example, hydrogen or helium at a suitable flow rate, such as between 10 and 50 SLM. In some specific embodiments, the deposition may be carried out using a germanium source precursor gas such as $GeH_4$ that is diluted in $H_2$ (e.g., the $GeH_4$ may be diluted at 1-20%). For instance, the diluted $GeH_4$ may be used at a 1% concentration and at a flow rate that ranges between 50 and 300 SCCM. For an in situ doping of boron, diluted $B_2H_6$ may be used (e.g., the $B_2H_6$ may be diluted in $H_2$ at 1-20%). For instance, the diluted $B_2H_6$ may be used at a 3% concentration and at a flow rate that ranges between 10 and 100 SCCM. In some example cases, an etching agent may be added to increase the selectivity of the deposition. For instance, HCl or $Cl_2$ may be added at a flow rate that ranges, for example, between 50 and 300 SCCM.

Numerous variations on the source/drain bi-layer construction will be apparent in light of this disclosure. For instance, in some embodiments, the liners 313/315 are implemented with epitaxially deposited boron doped SiGe, which may be in one or more layers, and have a germanium concentration in the range of 30 to 70 atomic %, or higher. As previously explained, this germanium concentration of the SiGe liner may be fixed or graded so as to increase from a base level (near substrate 300) to a high level (e.g., in excess of 50 atomic %, near a base concentration of the germanium concentration of caps 318/320, which continue with the germanium gradient to 100 atomic %). The boron concentration in some such embodiments can be in excess of 1E20 $cm^{-3}$, such as higher than 5E20 $cm^{-3}$ or 2E21 $cm^{-3}$, and may also be graded so as to increase from a base level near substrate 300 to a high level (e.g., in excess of 1E20 $cm^{-3}$ or 2E20 $cm^{-3}$ or 3E20 $cm^{-3}$, etc, near caps 318/320). In embodiments where the germanium concentration of boron doped SiGe liners 313/315 is fixed, a thin graded buffer may be used to better interface the liners 313/315 with the boron doped caps 318/320. Note this buffer can be an intermediate layer or otherwise integrated into the composition of the caps 318/320. For purposes of this disclosure, such a buffer can be treated as part of the caps 318/320. The thickness of the boron doped SiGe deposited layer (or collection of layers) 313/315 may range, for example, from monolayers to 50 nm, and the layer (or collection of layers) 318/320 may have a thickness in the range, for example, of 51 to 500 nm, in accordance with some specific embodiments, although alternative embodiments may have other liner and cap thicknesses, as will be apparent in light of this disclosure. In some embodiments, note that cavities 312/314 may be created underneath the spacers during cyclical deposition-etch processing, and those cavities 312/314 can be backfilled by an epitaxial cap layer as well (which can have, for example, the same composition as the boron doped germanium caps 318/320).

As will further be appreciated in light of this disclosure, the combination of high germanium concentration (e.g., in excess of 50 atomic % and up to pure germanium) and high boron concentration (e.g., in excess of 1E20 $cm^{-3}$), as discussed herein, can be used to realize significantly higher conductance in the source and drain regions (R3 in FIG. 1) as well as their respective tip regions (R2 in FIG. 1) in PMOS transistor devices. Further, and as previously explained, since boron diffusion is sufficiently suppressed in high germanium composition layers relative to lower germanium composition layers, less adverse SCE degradation is realized with subsequent thermal anneals when comparing to a lower germanium composition layer with equal p-type dopant species and doping levels despite high doping levels in the deposited stressor film. Barrier height lowering is also enabled from the higher concentration of germanium at the contact surface resulting in lower contact resistance R4 in FIG. 1. In some example embodiments, a germanium concentration in excess of 80 atomic % and up to pure germanium (100 atomic %) can be used to achieve such benefits. Note that pure germanium is not required, however. For instance, some embodiments may have a germanium concentration in excess of 90 or 95 atomic %, but not be pure.

As further seen with reference to FIG. 3C, forming the source/drain tips 318A/320A in relatively close proximity to the channel region also imparts a larger hydrostatic stress on the channel. This stress increases the strain within the channel, thereby increasing mobility in the channel and increasing drive current. This stress can be further amplified by increasing the germanium concentration of the source/drain tips 318A/320A in the case of a silicon-containing substrate, and by increasing the tin concentration in the case of a germanium substrate. This is an improvement over diffusion-based processes where the tip regions generally do not induce a strain on the channel region.

Figure 3D:
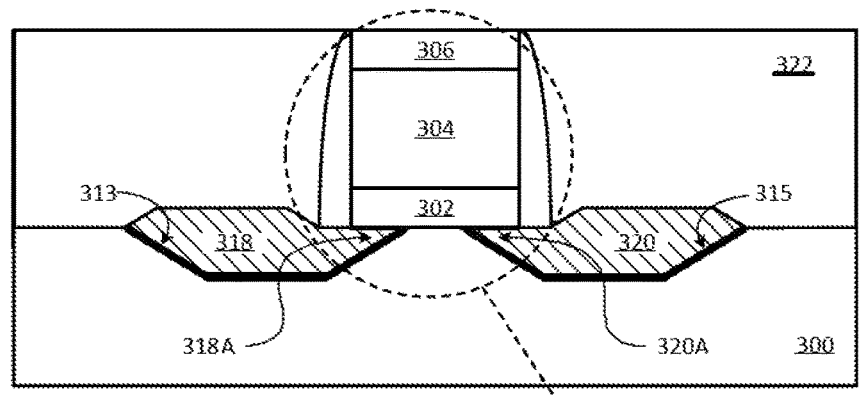
Figure 3D:
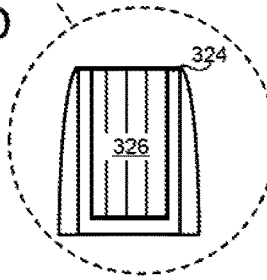

Once the source and drain regions are filled in accordance with an embodiment of the present invention, various conventional MOS processing can be carried out to complete fabrication of a MOS transistor, such as replacement gate oxide processes, replacement metal gate processes, annealing, and salicidation processes, that may further modify the transistor and/or provide the necessary electrical interconnections. For instance, after the epitaxial deposition of the source/drain regions along with their respective tips, and with further reference to FIG. 2, the method may continue with removing 212 any masking from n-type regions and processing those regions as desired (if applicable, such as in a CMOS process), and depositing 214 an insulator over the transistor, and then planarizing that insulator layer as commonly done. The insulator layer may be formed using materials known for the applicability in insulator layers for integrated circuit structures, such as low-k dielectric (insulator) materials. Such insulator materials include, for example, oxides such as silicon dioxide ($SiO_2$) and carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. In some example configurations, the insulator layer may include pores or other voids to further reduce its dielectric constant. FIG. 3D illustrates an example insulator layer 322 that has been deposited and then planarized down to the hard mask 306.

As can be further seen with reference to FIG. 3D', some embodiments of the present invention use a replacement metal gate process, and the method may include removing the gate stack (including the high-k gate dielectric layer 302, the sacrificial gate electrode 304, and the hard mask layer 306) using an etching process as conventionally done. In alternate implementations, only the sacrificial gate 304 is removed. If the gate dielectric 302 is removed, the method may include depositing a new gate dielectric layer into the trench opening. Any suitable high-k dielectric materials such as those previously described may be used here, such as hafnium oxide. The same deposition processes may also be used. Replacement of the gate dielectric 302 may be used, for example, to address any damage that may have occurred to the original gate dielectric layer during application of the dry and wet etch processes, and/or to replace a low-k or sacrificial dielectric material with a high-k or otherwise desired gate dielectric material. The method may then continue with depositing the metal gate electrode layer into the trench and over the gate dielectric layer. Conventional metal deposition processes may be used to form the metal gate electrode layer, such as CVD, ALD, PVD, electroless plating, or electroplating. The metal gate electrode layer may include, for example, a p-type workfunction metal, such as ruthenium, palladium, platinum, cobalt, nickel, and conductive metal oxides, e.g., ruthenium oxide. In some example configurations, two or more metal gate electrode layers may be deposited. For instance, a workfunction metal may be deposited followed by a suitable metal gate electrode fill metal such as aluminum. FIG. 3D' illustrates an example high-k gate dielectric layer 324 and a metal gate electrode 326 that have been deposited into the trench opening, in accordance with one embodiment. Note that such a RMG process may be carried out at a different time in the process, if so desired.

Figure 3E:
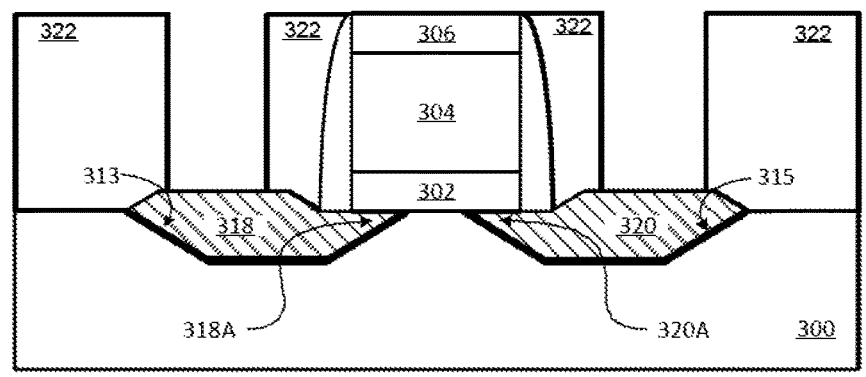

With further reference to FIG. 2, after insulator layer 322 is provided (and any desired pre-contact formation RMG process), the method continues with etching 216 to form the source/drain contact trenches. Any suitable dry and/or wet etch processes can be used. FIG. 3E shows the source/drain contact trenches after etching is complete, in accordance with one example embodiment.

Figure 3F:
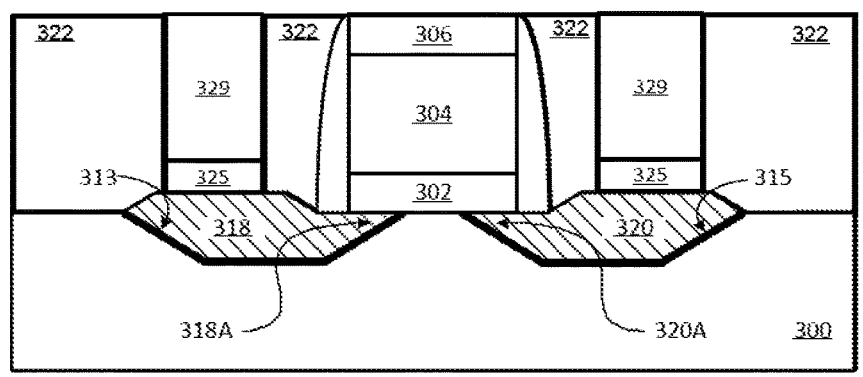

The method then continues with depositing 218 contact resistance reducing metal and annealing, and then depositing 220 the source/drain contact plugs. FIG. 3F shows the contact resistance reducing metals 325, which in some embodiments include silver, nickel, aluminum, titanium, gold, gold-germanium, nickel-platinum or nickel-aluminum, and/or other such resistance reducing metals or alloys. FIG. 3F further shows the contact plug metal 329, which in some embodiments includes aluminum or tungsten, although any suitably conductive contact metal or alloy can be used, such as silver, nickel-platinum or nickel-aluminum or other alloys of nickel and aluminum, or titanium, using conventional deposition processes. Metallization of the source/drain contacts can be carried out, for example, using a germanidation process (generally, deposition of contact metal and subsequent annealing). For instance, germanidation with nickel, aluminum, nickel-platinum or nickel-aluminum or other alloys of nickel and aluminum, or titanium with or without germanium pre-amorphization implants can be used to form a low resistance germanide. The boron doped germanium caps 318/320 allow for metal-germanide formation (e.g., nickel-germanium). The germanide allows for significantly lower Schottky-barrier height and improved contact resistance over that in conventional metal-silicide systems. For instance, conventional transistors typically use a source/ drain SiGe epi process, with germanium concentration in the range of 30-40 atomic %. Such conventional systems exhibit Rext values of about 140 Ohm-um, limited by epi/silicide interfacial resistance, which is high and may impede future gate pitch scaling. Some embodiments of the present invention allow for a significant improvement in Rext in PMOS devices (e.g., a 2× or better improvement, such as an Rext of about 70 Ohm-um, or less), which can better support PMOS device scaling. Thus, transistors having a source/drain configured with a bi-layer source/drain structure as described herein, can exhibit relatively lower Rext values compared to conventional transistors.

Non-Planar Configuration

A non-planar architecture can be implemented, for instance, using FinFETs or nanowire configurations. A FinFET is a transistor built around a thin strip of semiconductor material (generally referred to as the fin). The transistor includes the standard field effect transistor (FET) nodes, including a gate, a gate dielectric, a source region, and a drain region. The conductive channel of the device resides on/within the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate FinFET. Other types of FinFET configurations are also available, such as so-called double-gate FinFETs, in which the conductive channel principally resides only along the two sidewalls of the fin (and not along the top of the fin).

Figure 4A:
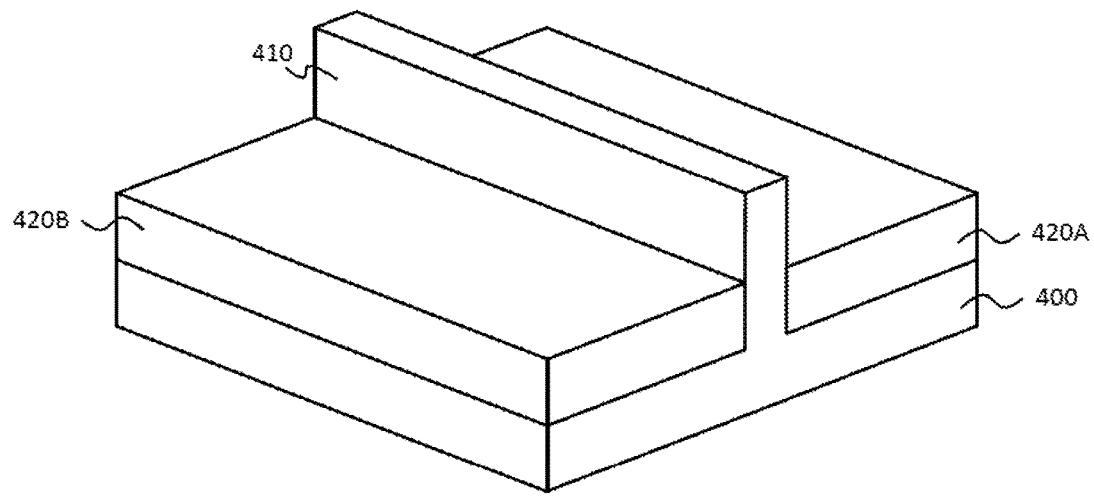
FIGS. 4A to 4G each shows a perspective view of a FinFET transistor structure formed in accordance with one embodiment of the present invention.

FIGS. 4A to 4G each shows a perspective view of a FinFET transistor structure formed in accordance with one embodiment of the present invention. The previous discussion with respect to FIGS. 2 through 3F is equally applicable here, as will be appreciated. As can be seen, the example non-planar configuration shown in FIG. 4A is implemented with a fin structure which includes a substrate 400 having a semiconductor body or fin 410 extending from the substrate 400 through shallow trench isolation (STI) layer 420. The substrate may be, for example, silicon, germanium, or SiGe.

Figure 4B:
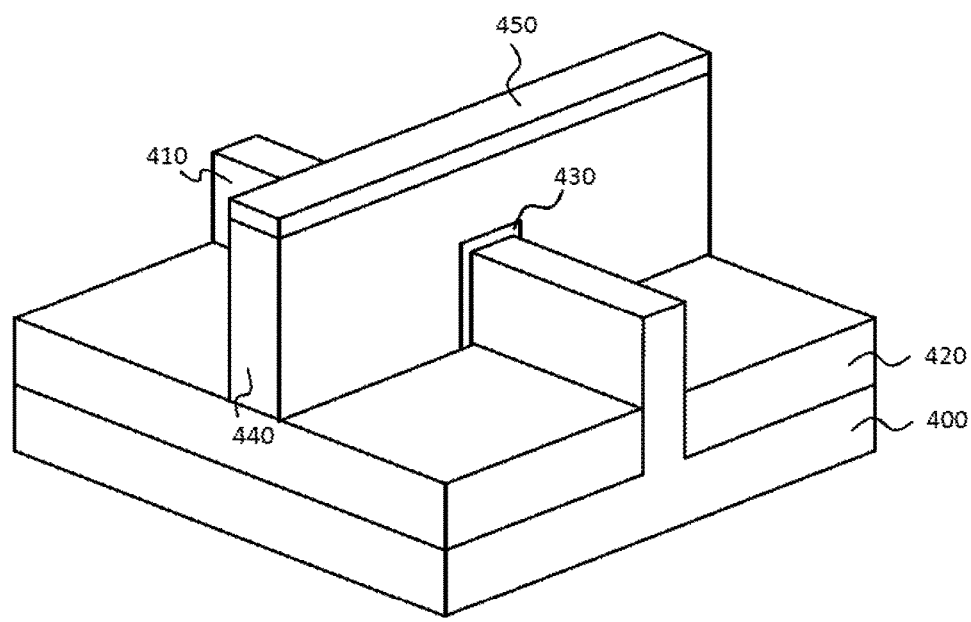
Figure 4C:
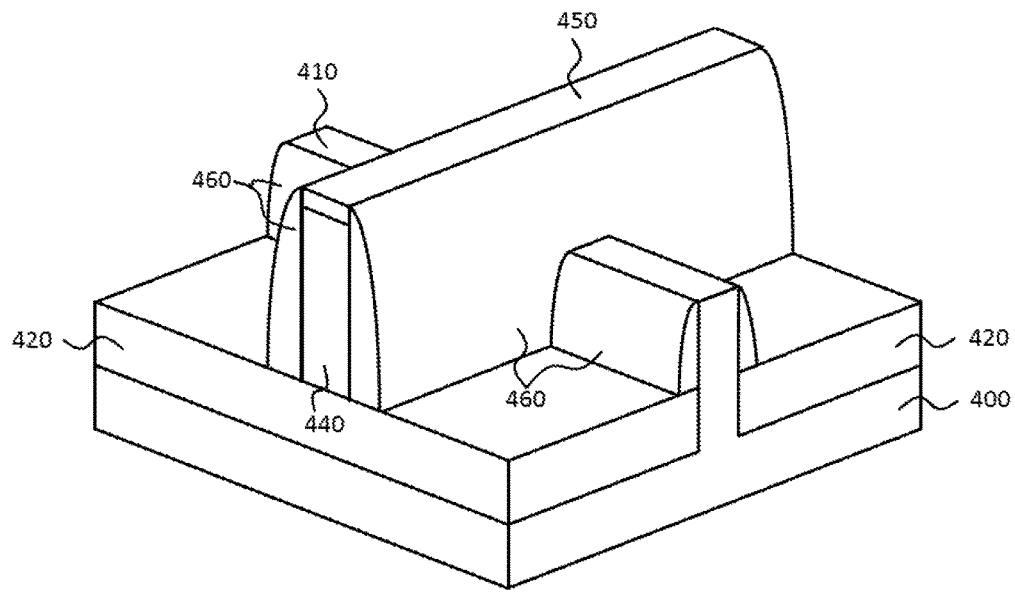

FIG. 4B shows a gate electrode 440 formed over three surfaces of the fin 410 to form three gates (hence, a tri-gate device). A gate dielectric material 430 is provided between the fin 410 and gate electrode 440, and hard mask 450 is formed on top of the gate electrode 440. FIG. 4C illustrates the resulting structure after deposition of insulating material and subsequent etch that leaves a coating of the insulator material on all vertical surfaces, so as to provide spacers 460.

Figure 4D:
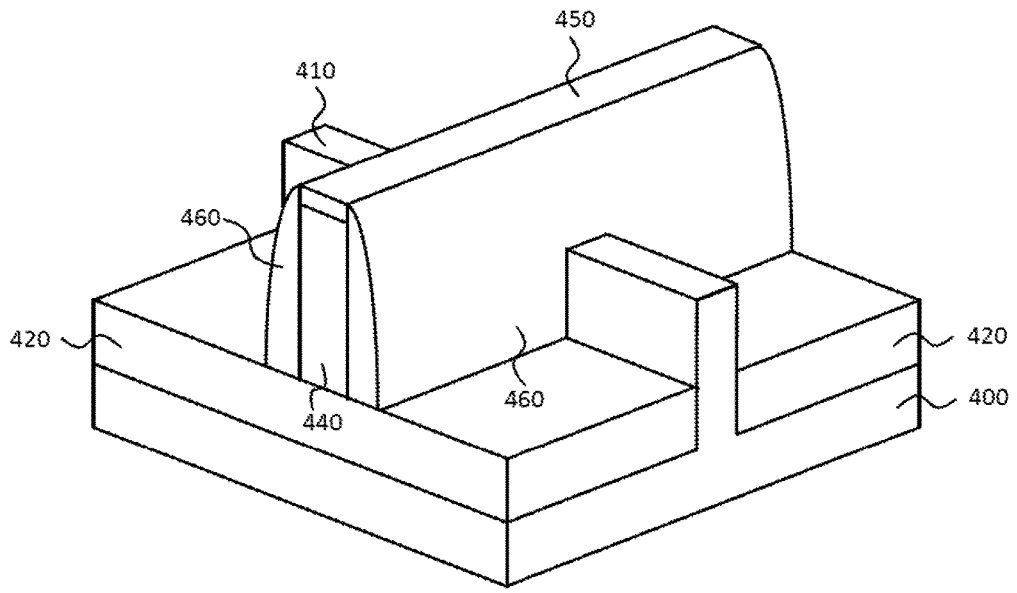
Figure 4E:
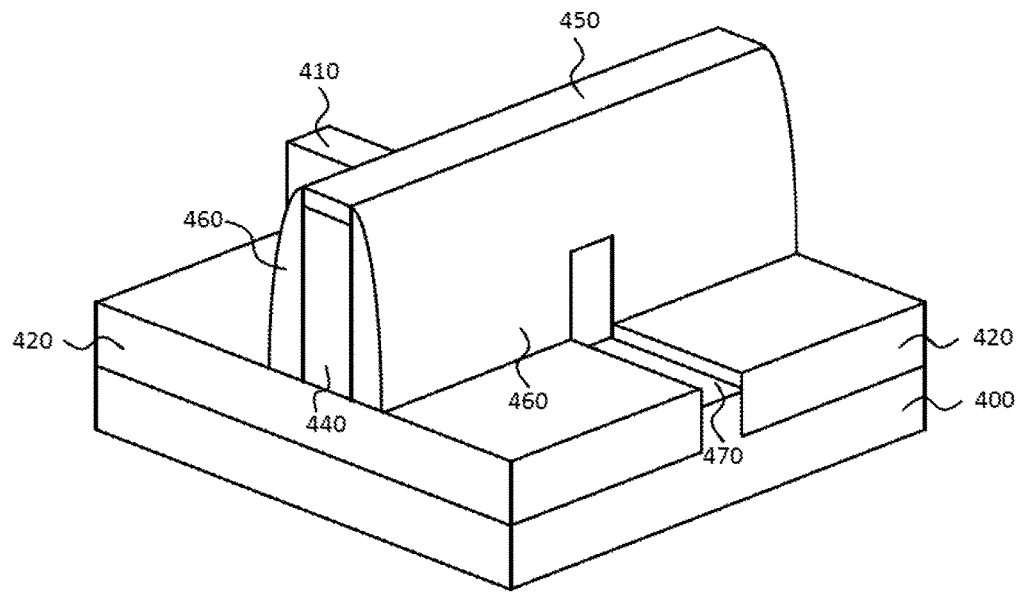

FIG. 4D illustrates the resulting structure after an additional etch treatment to eliminate excess insulating/spacer material from sidewalls of fin 410, thereby leaving only spacers 460 opposite sidewalls of the gate electrode 440. FIG. 4E illustrates the resulting structure after a recess etch to remove fin 410 in the source/drain region of substrate 400, thereby forming recess 470. Note that other embodiments may not be recessed (e.g., source/drain region is flush with STI layer 420).

Figure 4F:
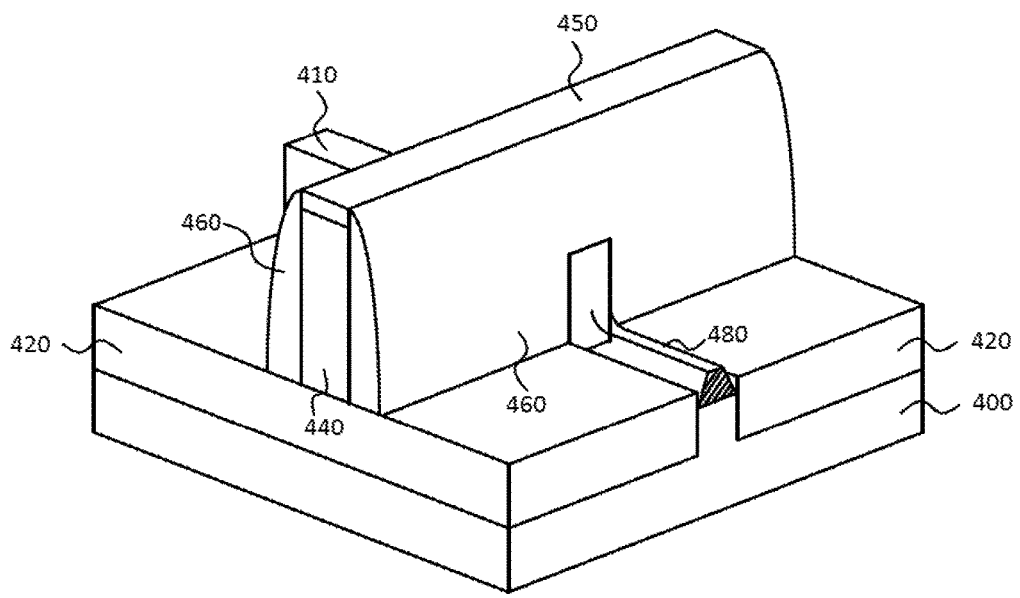
Figure 4G:
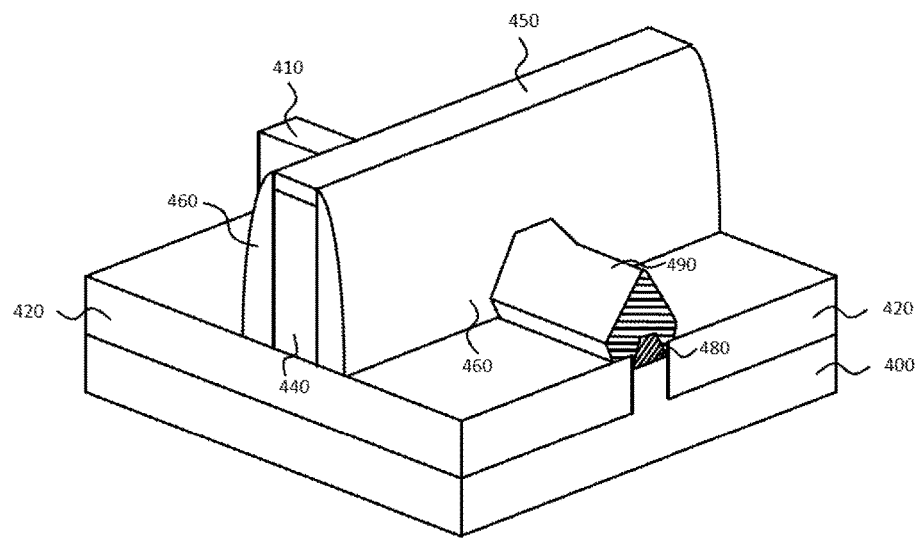

FIG. 4F illustrates the resulting structure after growth of epitaxial liner 480, which may be thin, p-type and contain significant fraction of silicon (e.g., silicon or SiGe having 70 atomic % silicon), or be pure germanium (e.g., a separate layer of germanium, or a non-detectable layer that is integrated or otherwise included in the composition of the caps 318/320). FIG. 4G illustrates the resulting structure after growth of epitaxial source/drain cap 490, which can be p-type, and comprise primarily germanium but may contain less than 20 atomic % tin or other suitable alloying material, as previously explained. As will be appreciated in light of this disclosure, conventional processes and forming techniques can be used to fabricate the FinFET transistor structure having the bi-layer source/drain structure as described herein.

As will further be appreciated, note that an alternative to the tri-gate configuration as shown is a double-gate architecture, which would include a dielectric/isolation layer on top of the fin 410. Further note that the example shapes of the liner 480 and cap 490 making up the source/drain regions shown in FIG. 4G are not intended to limit the claimed invention to any particular source/drain types or formation processes, and other source/drain shapes will be apparent in light of this disclosure (e.g., round, square or rectangular source/drain regions may be implemented).

Figure 5A:
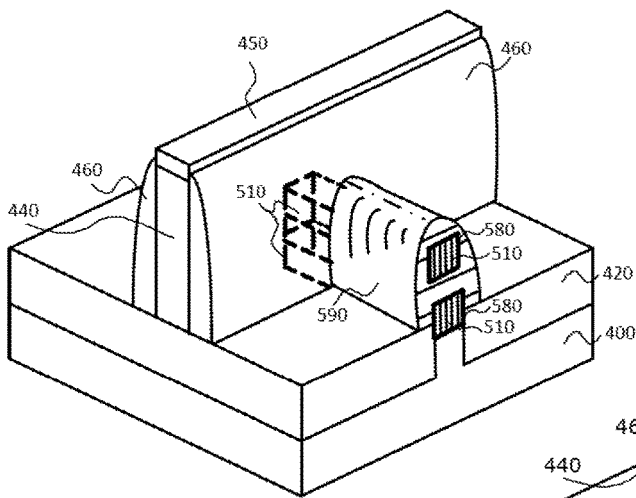
FIGS. 5A and 5B each shows a perspective view of a nanowire transistor structure formed in accordance with an embodiment of the present invention.
Figure 5B:
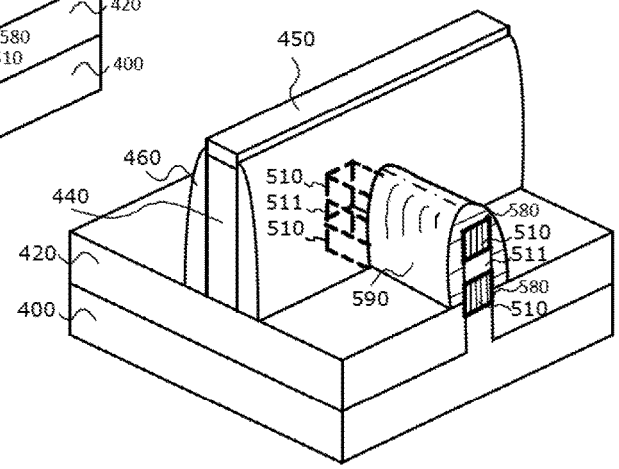

FIG. 5A shows a perspective view of a nanowire transistor structure formed in accordance with one embodiment of the present invention. A nanowire transistor (sometimes referred to as gate-all-around FET) is configured similarly to a fin-based transistor, but instead of a fin, a nanowire is used and the gate material generally surrounds the channel region on all sides. Depending on the particular design, some nanowire transistors have, for instance, four effective gates. FIG. 5A illustrates a nanowire channel architecture having two nanowires 510, although other embodiments can have any number of wires. The nanowires 510 can be implemented, for example, with p-type silicon or germanium or SiGe nanowire. As can be seen, one nanowire 510 is formed or otherwise provided in a recess of substrate 400 and the other nanowire 510 effectively floats in the source/drain material bi-layer construction comprising liner 580 and cap 590. Just as with the fin configuration, note that the nanowire 510 can be replaced in the source/drain regions with a bi-layer construction of source/drain material as described herein (e.g., relatively thin silicon or germanium or SiGe liner and relatively thick high concentration germanium cap). Alternatively, the bi-layer construction can be provided around the originally formed nanowire 510 as shown (where liner 580 is provided around nanowire 510, and cap 590 is then provided around liner 580). FIG. 5B also illustrates a nanowire configuration having multiple nanowires 510, but in this example case, non-active material 511 is not removed from between the individual nanowires during the nanowire forming process, which can be carried out using various conventional techniques, as will be appreciated in light of this disclosure. Thus, one nanowire 510 is provided in a recess of substrate 400 and the other nanowire 510 effectively sits on top of the material 511. Note the nanowires 510 are active through the channel, but the 511 material is not. As can be seen, the bi-layer source/drain construction of liner 580 and cap 590 is provided around all other exposed surfaces of the nanowires 510.

Example System

Figure 6:
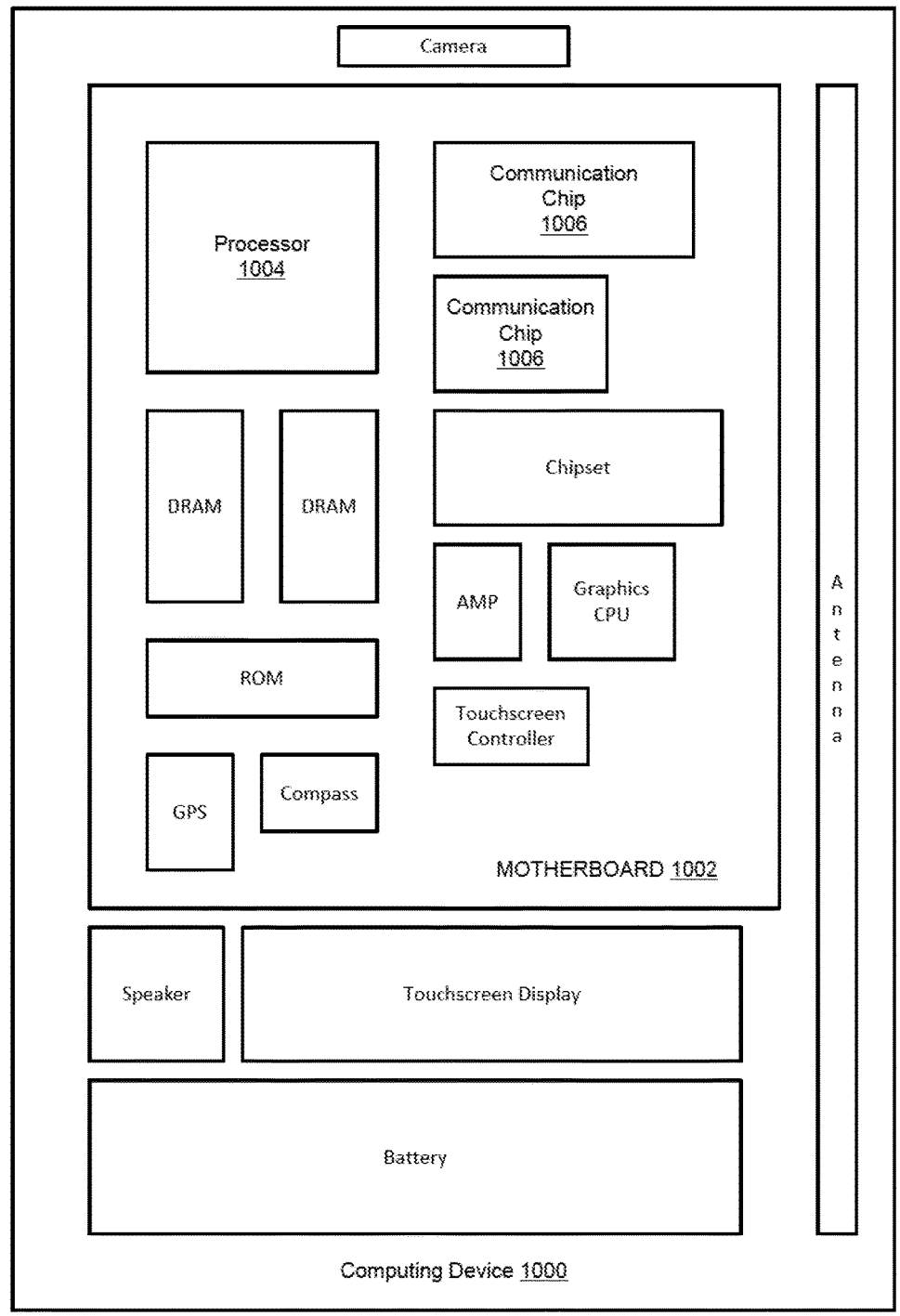
FIG. 6 illustrates a computing system implemented with one or more transistor structures in accordance with an example embodiment of the present invention.

FIG. 6 illustrates a computing system 1000 implemented with one or more transistor structures configured in accordance with an example embodiment of the present invention. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more transistor structures as described herein (e.g., having a bi-layer source/drain structure comprising a relatively thin p-type silicon or germanium or SiGe liner and a relatively thicker p-type high germanium content cap). These transistor structures can be used, for instance, to implement an on-board processor cache or memory array. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more transistor structures (e.g., PMOS or CMOS) as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more circuits implemented with one or more transistor structures as described herein (e.g., on-chip processor or memory). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs low resistance transistor devices as described herein (e.g., PMOS and CMOS circuitry).

Numerous embodiments will be apparent, and features described herein can be combined in any number of configurations. One example embodiment of the present invention provides a transistor device. The device includes a substrate having a channel region, a gate electrode above the channel region, and source and drain regions formed on or in the substrate and adjacent to the channel region. Each of the source and drain regions has a total thickness comprising a p-type liner of silicon or germanium or silicon germanium, and a p-type cap having a germanium concentration in excess of 80 atomic %, wherein the liner is less than 50% of the total thickness. In some cases, the device is one of a planar, FinFET, or nanowire PMOS transistor. In some cases, the device further includes metal-germanide source and drain contacts. In some cases, the thickness ratio of liner thickness to cap thickness is 2:5, or less (liner is 40% or less of the total thickness). In some cases, the thickness ratio of liner thickness to cap thickness is 1:5, or less (liner is 20% or less of the total thickness). In some cases, each of the liners has a thickness in the range of about one monolayer to 10 nm, and each of the caps has a thickness in the range of about 50 nm to 500 nm. In some cases, at least one of the liners and/or caps has at least one of a graded concentration of germanium and/or p-type dopant. For instance, in some cases, at least one of the liners has a germanium concentration that is graded from a base level concentration compatible with the substrate to a high concentration in excess of 50 atomic %. In one such case, the high concentration is in excess of 90 atomic %. In some cases, at least one of the liners has a p-type dopant concentration that is graded from a base level concentration compatible with the substrate to a high concentration in excess of 1E20 $cm^{-3}$. In one such case, the p-dopant of the one or more liners is boron. In some cases, at least one of the caps has a germanium concentration in excess of 95 atomic %. In some cases, at least one of the caps has a germanium concentration that is graded from a base level concentration compatible with the corresponding liner to a high concentration in excess of 80 atomic %. In some cases, at least one of the caps has a p-type dopant concentration that is graded from a base level concentration compatible with the corresponding liner to a high concentration in excess of 1E20 $cm^{-3}$. In one such case, the p-dopant of the one or more caps is boron. In some cases, at least one of the caps further comprises tin. Numerous variations will be apparent. For instance, in some example cases the substrate is a silicon-containing substrate. In some such cases, the p-type liner comprises silicon or silicon germanium. In other example cases, the substrate is a germanium substrate. In some such cases, the p-type liner is p-type germanium. In some example such cases, each liner is included in the composition of the corresponding cap (such that a distinct and separate liner layer may not be discernible from a distinct and separate cap layer). In some cases, at least one of the caps further comprises misfit dislocations and/or threading dislocations and/or twins, while in other cases, the caps are free of misfit dislocations, threading dislocations, and twins. Another embodiment of the present invention includes an electronic device that includes a printed circuit board having an integrated circuit including one or more transistor devices as variously defined in this paragraph. In one such case, the integrated circuit comprises at least one of a communication chip and/or a processor. In some cases, the electronic device is a computing device.

Another embodiment of the present invention provides an integrated circuit. The circuit includes a substrate (e.g., silicon, SiGe, or germanium) having a channel region, a gate electrode above the channel region, source and drain regions formed on or in the substrate and adjacent to the channel region, and metal-germanide source and drain contacts. Each of the source and drain regions has a total thickness comprising a p-type liner of silicon or germanium or silicon germanium and a p-type cap having a germanium concentration in excess of 80 atomic %, wherein the liner is 40% or less of the total thickness. In some cases, the thickness ratio of liner thickness to cap thickness is 1:5, or less. In some case, at least one of the caps further comprises tin.

Another embodiment of the present invention provides a method for forming a transistor device. The method includes providing a substrate having a channel region, providing a gate electrode above the channel region, and providing source and drain regions formed on or in the substrate and adjacent to the channel region. Each of the source and drain regions has a total thickness comprising a p-type liner of silicon or germanium or silicon germanium and a p-type cap having a germanium concentration in excess of 80 atomic %, wherein the liner is less than 50% of the total thickness. In some cases, the method includes providing metal-germanide source and drain contacts. In some cases, the thickness ratio of liner thickness to cap thickness is 2:5, or less. In some cases, at least one of the liners and/or caps has at least one of a graded concentration of germanium and/or p-type dopant. In some cases, at least one of the caps further comprises tin (or other suitable strain inducer).

The foregoing description of example embodiments of the invention has been presented for the purposes of illustration and description. It is not intended to be exhaustive or to limit the invention to the precise forms disclosed. Many modifications and variations are possible in light of this disclosure. For instance, while some embodiments of the present invention utilize in situ boron doping of germanium, other embodiments may use an intrinsic germanium that after its deposition is subsequently subjected to p-type dopant implantation and annealing processes to provide the desired p-type doping concentration. Moreover, some embodiments may include source and drain regions fabricated as described herein, but still use conventional processing (e.g., implantation and annealing) to form the tips of the source and drain regions. In such embodiments, the tips may have a lower germanium and/or p-type dopant concentration than the main source/drain region, which may be acceptable in some applications. In still other embodiments, only tips of the source and drain regions may be configured with the high germanium and p-type dopant concentrations and the main portions of the source and drain regions may have conventional or otherwise lower germanium/dopant concentrations.

It is intended that the scope of the invention be limited not by this detailed description, but rather by the claims appended hereto.

What is claimed is:

1. A integrated circuit device, comprising:
   a fin including silicon;
   a gate electrode over a portion of the fin; and
   a source region and a drain region, the portion of the fin between the source and drain regions, each of the source and drain regions having a total thickness comprising a p-type liner of one or both of silicon or germanium and a p-type cap having a germanium concentration in excess of 80 atomic %, wherein the p-type liner is less than 50% of the total thickness, and wherein the p-type liner is between the p-type cap and the portion of the fin, and wherein the p-type cap of each of the source and the drain regions includes one or more dislocations, the one or more dislocations including at least one of a misfit dislocation or a threading dislocation.

2. The device of claim 1 wherein the portion of the fin includes one or more nanowires.

3. The device of claim 1 further comprising metal-germanide source and drain contacts over the p-type caps.

4. The device of claim 1 wherein the thickness ratio of liner thickness to cap thickness is 2:5, or less.

5. The device of claim 1 wherein the portion of the fin is also between portions of the gate electrode.

6. The device of claim 1 wherein each of the liners has a thickness in the range of about one monolayer to 10 nm, and each of the caps has a thickness in the range of about 50 nm to 500 nm.

7. The device of claim 1 wherein at least one of the liners or caps has at least one of a graded concentration of germanium or p-type dopant.

8. The device of claim 7 wherein at least one of the liners has a germanium concentration that is graded from a base level concentration compatible with the portion of the fin to a high concentration in excess of 50 atomic %.

9. The device of claim 8 wherein the high concentration is in excess of 90 atomic %.

10. The device of claim 7 wherein at least one of the liners has a p-type dopant concentration that is graded from a base level concentration compatible with the portion of the fin to a high concentration in excess of 1E20 $cm^{-3}$.

11. The device of claim 10 wherein the p-dopant of the at least one of the liners is boron.

12. The device of claim 7 wherein at least one of the caps has a germanium concentration in excess of 95 atomic %.

13. The device of claim 7 wherein at least one of the caps has a germanium concentration that is graded from a base level concentration compatible with the corresponding liner to a high concentration in excess of 80 atomic %.

14. The device of claim 7 wherein at least one of the caps has a p-type dopant concentration that is graded from a base level concentration compatible with the corresponding liner to a high concentration in excess of 1E20 $cm^{-3}$.

15. The device of claim 14 wherein the p-dopant of the at least one of the caps is boron.

16. The device of claim 1 wherein at least one of the caps further comprises tin.

17. An integrated circuit, comprising:
    a fin including silicon;
    a gate electrode over a portion of the fin; and
    a source region and a drain region, the portion of the fin between the source and drain regions, each of the source and drain regions comprising one or more nanowires, each nanowire including a bi-layer construction having a total thickness comprising a p-type liner of one or both of silicon or germanium and a p-type cap having a germanium concentration in excess of 80 atomic %, wherein the liner is less than 40% of the total thickness, and wherein the p-type liner is between the p-type cap and the portion of the fin, and wherein the p-type cap of each of the source and drain regions includes one or more dislocations, the one or more dislocations including at least one of a misfit dislocation or a threading dislocation, and wherein the portion of the fin includes compressive strain.

18. The circuit of claim 17 wherein the thickness ratio of liner thickness to cap thickness is 1:5, or less.

19. The circuit of claim 17 wherein at least one of the caps further comprises tin in a concentration of 20% or less.

20. The circuit of claim 17 further comprising metal-germanide source and drain contacts over the p-type caps.

* * * * *